United States Patent
Lee et al.

(10) Patent No.: US 6,680,625 B1
(45) Date of Patent: Jan. 20, 2004

(54) SYMMETRICAL CML LOGIC GATE SYSTEM

(75) Inventors: Kochung Lee, Sunnyvale, CA (US); Ming Qu, San Jose, CA (US); Xueping Jiang, Cupertino, CA (US); Xiang Zhu, Sunnyvale, CA (US)

(73) Assignee: Lattice Semiconductor Corp., Hillsboro, OR (US)

( * ) Notice: Subject to any disclaimer, the term of this patent is extended or adjusted under 35 U.S.C. 154(b) by 102 days.

(21) Appl. No.: 10/066,031

(22) Filed: Jan. 31, 2002

(51) Int. Cl.[7] .............................................. H03K 19/20
(52) U.S. Cl. ........................ 326/115; 326/127; 326/54; 326/55
(58) Field of Search .............................. 326/54, 55, 115, 326/126, 127

(56) References Cited

U.S. PATENT DOCUMENTS

| | | | |
|---|---|---|---|
| 6,194,917 B1 | * | 2/2001 | Deng ........................... 327/12 |
| 6,414,519 B1 | * | 7/2002 | Abernathy ................... 326/127 |
| 6,433,612 B1 | * | 8/2002 | Jenkins ....................... 327/408 |

* cited by examiner

*Primary Examiner*—Anh Tran

(57) ABSTRACT

High speed CML logic gate systems for providing selected Boolean logic functions. Two halves of a substantially symmetric first system, having a relatively small number (14) of CMOS transistors, are used to generate any of the logic functions AND, NAND, OR and NOR. Two halves of a substantially symmetric second system having another small number (10) of transistors are used to generate any of the logic functions XOR, XNOR and NOT. In either system, the sum of currents passing through certain voltage-controlling gates is substantially constant.

8 Claims, 2 Drawing Sheets

US 6,680,625 B1

SYMMETRICAL CML LOGIC GATE SYSTEM

FIELD OF THE INVENTION

This invention relates to high speed CML logic gate systems for providing logic functions, such as AND, OR and XOR.

BACKGROUND OF THE INVENTION

Several digital systems that provide circuits for generating logic functions, such as AND, OR, NAND, NOR and XOR (EXclusive OR) do so using circuits that are complex and non-symmetrical so that at least two different sub-systems must be fabricated and joined in order to generate one or more of these logic functions. What is needed is a system that uses symmetrical and simpler circuits to generate the logic functions and that has the flexibility to provide other logic functions as well, through change of one or a few input control voltages.

SUMMARY OF THE INVENTION

These needs are met by the invention, which provides a single, symmetrical circuit that can be converted to generate (1) AND, NAND, OR and NOR logic functions and (2) XOR and XNOR logic functions by changing the relative voltage levels at one or more of six control input terminals. No other changes are required to switch between generating one type of logic function to generating another type of logic function. Each circuit uses no more than 15 transistors, four resistors and a capacitor and accepts three input control signals and first and second data input signal pairs.

DESCRIPTION OF BEST MODES OF THE INVENTION

Figure 1:
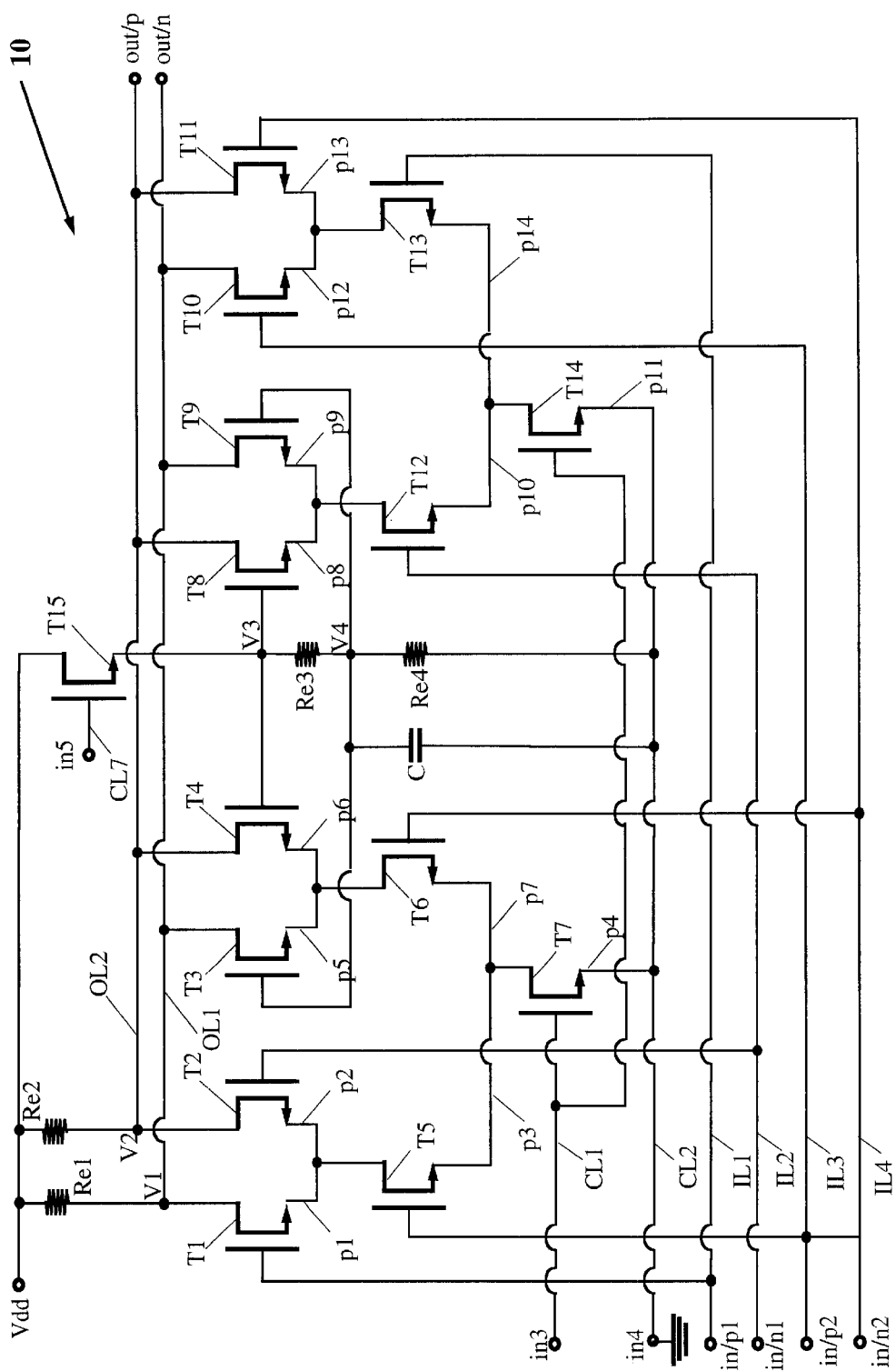
FIGS. 1 and 2 illustrate symmetrical circuits, constructed according to the invention, for generating at least seven different logic functions.

A first embodiment of a circuit 10, constructed to provide an AND logic function according to the invention, is illustrated in FIG. 1, which includes 15 NMOS (or PMOS) transistors, first and second resistors with a selected resistance value, third and fourth resistors with selected resistance values, and a capacitor with a selected capacitance value.

Drains of first and second NMOS transistors, T1 and T2, are connected through respective first and second resistors (identified as Re1 and Re2, with selected matched resistance values) to a voltage reference source $V_{dd}$ (≈1–1.8 V). Drains of third and fourth NMOS transistors, T3 and T4, are connected directly through first and second output lines, OL1 and OL2, to the drains of the first and second transistors, T1 and T2, respectively. Sources of the first and second transistors, T1 and T2, are connected to the drain of a fifth NMOS transistor T5, and sources of the third and fourth transistors, T3 and T4, are connected to the drain of a sixth NMOS transistor T6. The sources of the fifth and sixth transistors, T5 and T6, are connected to the drain of a seventh NMOS transistor T7, whose source is connected to ground potential.

Four input lines, IL1, IL2, IL3 and IL4, provide respective input control signal pairs {in/p1, in/n1} and {in/p2, in/n2}, corresponding to positive node and negative node signals to be delivered to different parts of the circuit. Gates of the first and second transistors, T1 and T2, are connected to the respective input lines IL1 and IL2. Gates of the fifth and sixth transistors, T5 and T6, are connected to the respective input lines IL3 and IL4.

Drains of eighth and ninth NMOS transistors, T8 and T9, are connected to the respective second and first output lines, OL2 and OL1. Drains of tenth and eleventh NMOS transistors, T10 and T11, are connected to the respective first and second output lines, OL1 and OL2. Sources of the eight and ninth transistors, T8 and T9, are connected to a drain of a twelfth NMOS transistor T12. Sources of the tenth and eleventh transistors, T10 and T11, are connected to a drain of a thirteenth NMOS transistor T13. Sources of the twelfth and thirteenth transistors, T12 and T13, are connected to a drain of a fourteenth NMOS transistor T14. Sources of the seventh and fourteenth transistors, T7 and T14, are connected to a (grounded) first input control line CL1. Gates of the seventh and fourteenth transistors, T7 and T14, are connected to a second control line CL2.

Gates of the twelfth and thirteenth transistors, T12 and T13, are connected to the respective second and first input lines, IL1 and IL2. Gates of the tenth and eleventh transistors, T10 and T11, are connected to the respective third and fourth input lines, IL3 and IL4.

A drain of a fifteenth PMOS transistor T15 is connected to the source voltage $V_{dd}$, and a source of the fifteenth transistor is connected to gates of the fourth and eighth transistors, T4 and T8, and through third and fourth resistors (designated as Re2 and Re3), with selected resistance values R2 and R3, arranged in series, to the first control line CL1. Gates of the third and ninth transistors, T3 and T9, are connected to each other and across the fourth resistor (R3) to the first control line CL1. A capacitor (C) is also connected between the gates of the third and ninth transistors, T3 and T9, and the grounded line CL1.

The first and second input lines, IL1 and IL2, operate as a pair with a single voltage V(in)=V(in/p1)−V(in/n1); and the third and fourth input lines, IL3 and IL4, operate as a pair with a single voltage V(in2)=V(in/p2)−V(in/n2), with the following conventions:

"V(in1)>0" corresponds to $V(in/p1) \geq V(thr)$ and V(in/n1)≈0,

"V(in1)<0" corresponds to $V(in/n1) \geq V(thr)$ and V(in/p1)≈0,

"V(in2)>0" corresponds to $V(in/p2) \geq V(thr)$ and V(in/n2)≈0,

"V(in2)<0" corresponds to $V(in/n2) \geq V(thr)$ and V(in/p2)≈0, where V(thr) is a gate voltage level sufficient to place the corresponding (NMOS) transistor in an active or "ON" state (90–100 percent of maximum current is passed) and "0" represents a gate voltage at which the corresponding transistor is inactive or "OFF" (0–10 percent of maximum current is passed).

FIG. 1 also indicates 14 current paths, designated as pj(j=1 . . . , 14), from a source of a first end transistor to a drain of a second end transistor, that are cleared or blocked in response to a gate voltage applied to the first end transistor. These paths are cleared or blocked according to the relative voltage levels of the input lines IL1 and IL2, and of the input lines IL3 and IL4, and the (fixed) voltage levels V(in3) and V(in4). The voltage V(in3) is a constant positive bias voltage, used to control current amplitudes for the gates of T7 and T14, which may be partly or fully "ON", and paths p4 and p11 are always clear.

The voltage V(in4) is always at ground so that paths p5 and p9 are blocked (T3 and T9 off). The resistances R2 and R3 are preferably chosen so that the the gates of the transistors T3 and T9 are "OFF" and the gates of the transistors T4 and T8 are partly or fully "ON." Thus, the paths p6 and p8 are always clear and the paths p5 and p9 are always blocked.

The following four permutations are possible for the input signal pairs on the input lines IL1, IL2, IL3 and IL4:

V(in1)>0, V(in2)>0: T1, T5, T10, T13 ON; paths p1, p3, p12, p14 clear; V1=V(out/n)<V2=V(out/p);

V(in1)>0, V(in2)<0: T1, T6, T11, T13 ON; paths p1, p7, p13, p14 clear; V1=V(out/n)>V2=V(out/p);

V(in1)<0, V(in2)>0: T2, T5, T10, T12 ON: paths p2, p3, p10, p12 clear; V1=V(out/n)>V2=V(out/p)

V(in1)<0, V(in2)<0: T2, T6, T11, T12 ON; paths p2, p7, p10, p13 clear; V1=V(out/n)>V2=V(out/p).

As indicated earlier, V(in3)>0 and V(in4)=0 are always satisfied. The voltages V(out/p)=V2 and V(out/n)=V1 are also considered as a pair, with V(out/p)−V(out/n)=V2−V1=V(out), using the same conventions as are used for V(in1) and for V(in2). With these definitions and conventions adopted, the relations between V(in1), V(in2) and V(out) are set forth in Table 1.

TABLE 1

First configuration output signals (AND)

| V(in1) | V(in2) | V(out) |
|---|---|---|
| >0 | >0 | >0 |
| >0 | <0 | <0 |
| <0 | >0 | <0 |
| <0 | <0 | <0 |

One verifies from Table 1 that the first configuration provides an AND logic function, in which the output voltage V(out) is "positive" (V(out)>V(thr)) only if both input voltage V(in1) and V(in2) are "positive."

One can invert the two input signals, V(in1) and V(in2), to obtain a NOR logic function, set forth in Table 2, in which the output signal is "negative" only if both (inverted) input signals are "positive."

TABLE 2

Second configuration output signals (NOR)

| V(in1)* | V(in2)* | V(out) |
|---|---|---|
| <0 | <0 | >0 |
| <0 | >0 | <0 |
| >0 | <0 | <0 |
| >0 | >0 | <0 |

One can invert the output signal V(out) fo obtain a NAND logic function, set forth in Table 3, in which the output signal is "negative" only if both (non-inverted) input signals are "positive."

TABLE 3

Third configuration output signals (NAND)

| V(in1) | V(in2) | V(out)* |
|---|---|---|
| >0 | >0 | <0 |
| >0 | <0 | >0 |
| <0 | >0 | >0 |
| <0 | <0 | >0 |

One can invert the two input signals, V(in1) and V(in2), and the output signal V(out) to obtain an OR logic function, as set forth in Table 4, in which the (inverted) output signal is "positive" whenever at least one of the (inverted) input signals is "positive."

TABLE 4

Fourth configuration output signals (OR)

| V(in1)* | V(in2)* | V(out)* |
|---|---|---|
| <0 | <0 | <0 |
| <0 | >0 | >0 |
| >0 | <0 | >0 |
| >0 | >0 | >0 |

An input signal, V(in1)=V(in/p1)−V(in/n1), may be inverted by interchanging the assignments or labels associated with the two corresponding input lines, IL1 and IL2. An input signal, V(in2)=V(in/p2)−V(in/n2), may be inverted by interchanging the assignments or labels associated with the two corresponding input lines, IL3 and IL4. An output signal, V(out)=V(out/p)−V(out/n), may be inverted by interchanging the assignments or labels associated with the two output lines, OL1 and OL2.

Figure 2:
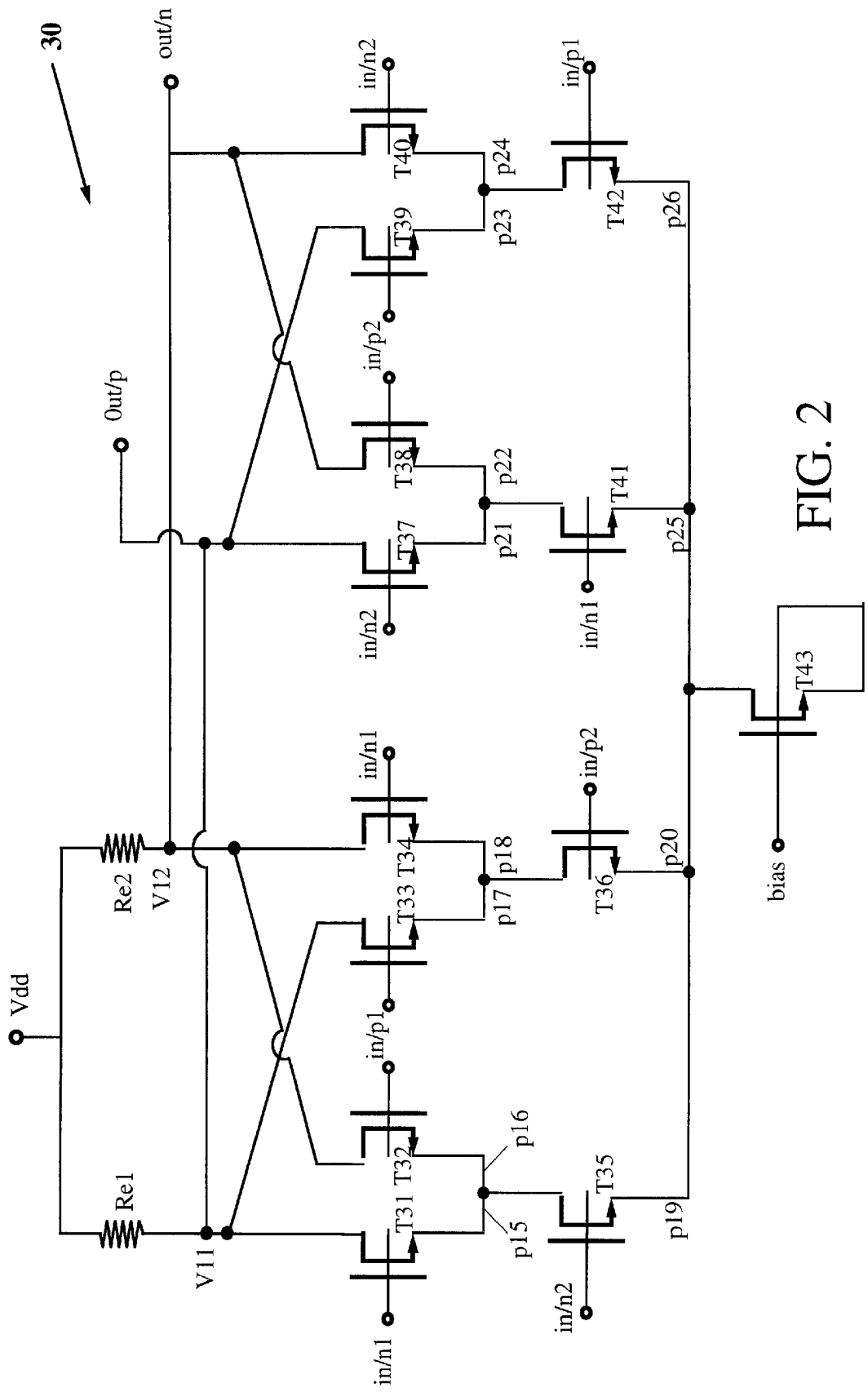

FIG. 2 illustrates a third embodiment of a circuit 30, constructed to provide an EXclusive OR (XOR) or Exclusive NOR (XNOR) function according to the invention. Drains of first and second NMOS transistors, T31 and T32, are connected through two matched resistors, Re1 and Re2, to a source of a reference voltage $V_{dd}$. The sources of the first and second transistors, T31 and T32, are connected to each other and to a drain of a fifth NMOS transistor T35, whose source is connected to a drain of a biased NMOS transistor T43 (e.g., biased at ground potential). Drains of third and fourth transistors, T33 and T34, are connected across the resistors Re1 and Re2 to the reference voltage source $V_{dd}$. The sources of the third and fourth transistors, T33 and T34, are connected to each other and to a drain of a sixth NMOS transistor T36, whose source is connected to the drain of the bias transistor T43.

Gates of the first and fourth transistors, T31 and T34, receive a first input signal in/n1. Gates of the second and third transistors, T32 and T33, receive a second input signal in/p1, with V(in/p1)−V(in/n1)=V(in1). Gates of the fifth and sixth transistors, T35 and T36, receive third and fourth input signals, in/n2 and in/p2, respectively, with V(in/p2)−V(in/n2)=V(in2). The voltage convention adopted for FIG. 2 is similar to the voltage convention adopted for FIG. 1:

"V(in1)>0" corresponds to V(in/p1)≥V(thr) and V(in/n1)≤0;

"V(in1)<0" corresponds to V(in/n1)≥V(thr) and V(in/p1)≤0;

"V(in2)>0" corresponds to V(in/p2)≥V(thr) and V(in/n2)≤0;

and

"V(in2)<0" corresponds to V(in/n2)≥V(thr) and V(in/p2)≤0.

Drains of seventh and eighth NMOS transistors, T37 and T38, are connected through the resistors, Re1 and Re2, to the reference voltage source $V_{dd}$. The sources of the seventh and eighth transistors, T37 and T37, are connected to each other and to a drain of a eleventh NMOS transistor T41, whose source is connected to the drain of the bias transistor T43. Drains of ninth and tenth transistors, T39 and T40, are connected across the resistors Re1 and Re2 to the reference voltage source $V_{dd}$. The sources of the ninth and tenth transistors, T39 and T40, are connected to each other and to a drain of a twelfth NMOS transistor T42, whose source is connected to the drain of the bias transistor T43.

Gates of the seventh and tenth transistors, T37 and T40, receive the third input signal in/n2. Gates of the eighth and ninth transistors, T38 and T39, receive the fourth input signal in/p2, with V(in/p2)−V(in/n2)=V(in2). Gates of the eleventh and twelfth transistors, T41 and T42, receive the first and second input signals, in/n1 and in/p1, respectively, with V(in/p1)−V(in/n1)=V(in1). The output signals are $V_{11}$=V(out/p) and $V_{12}$=V(out/n), with V(out)=V(out/p)−V(out/n) and the same convention as for V(in1) and V(in2).

The following four permutations of values are possible for the first and second input line voltages:

V(in1)>0, V(in2)>0: *T32, T33, T36, T38, T39, T42* ON; paths *p16, p17, p20, p22, p23, p26* clear; V(out)<0;

V(in1)>0, V(in2)<0: *T32, T33, T35, T37, T40, T42* ON; paths *p16, p17, P19, p21, p24, p26* clear; V(out)>0;

V(in1)<0, V(in2)>0: *T31, T34, T36, T38, T39, T41* ON; paths *p15, p18, p20, p22, p23, p25* clear; V(out)>0;

V(in1)<0, V(in2)<0: *T31, T34, T35, T37, T40, T41* ON; paths *p15, p18, p19, p21, p24, p25* clear; V(out)<0.

These results correspond to the Exclusive OR ("XOR") function and are summarized in Table 5

TABLE 5

Fifth configuration output signals (XOR)

| V(in1) | V(in2) | V(out) |
| --- | --- | --- |
| >0 | >0 | <0 |
| >0 | <0 | >0 |
| <0 | >0 | >0 |
| <0 | <0 | <0 |

Applying DeMorgan's rules to confirm the relation $$(A\ XOR\ B)^* = A^*XOR\ B = A\ XOR\ B^* = A\ XNOR\ B, \quad (1)$$

which is equal to "1" if and only if the Boolean variables A and B are different, the XNOR logical function, summarized in Table 6, is obtained by inverting either one, but not both, of the input variables, or by inverting the output variable (and none of the input variables).

TABLE 6

Sixth configuration output signals (XNOR)

| V(in1) | V(in2) | V(out) |
| --- | --- | --- |
| >0 | >0 | >0 |
| >0 | <0 | <0 |
| <0 | >0 | <0 |
| <0 | <0 | >0 |

The two circuits shown in FIGS. 1 and 2, together with the input signal and output signal inversions discussed, provide six basic logical functions: AND, NOR, OR, NAND, XOR and XNOR. By setting A equal to a selected value (e.g., A=1 or A=0) in Eq. (1), one obtains a seventh logical function, the NOT or inversion function: 1 XOR B=B* or 0 XNOR B=B* from the circuit in FIG. 2. Other logical functions can be built from these seven functions.

The circuits shown in FIGS. 1 and 2 are arranged so that the total current at each of selected transistor gates, T5, T6, T7, T12, T13, T14, T35, T36, T41 and T42, is substantially constant for each of the four permutations of input voltages. Because of this arrangement, the voltage swing associated with a transition between a first state and a second state is limited to an estimated ±200 millivolts (mV), or a maximum swing of about 400 mV. In a conventional circuit, by comparison, the total or maximum swing will range from 1000 to 1800 mV. The time interval required for transition, using the circuits shown in FIGS. 1 and 2, is estimated to be about one-third the length of a time interval required for transition in a conventional circuit so that the invention provides higher switching speeds.

A second advantage of the invention is reduced noise amplitudes, which occurs in part because of the symmetric arrangement of each of the circuits in FIGS. 1 and 2, at the level of corresponding pairs of transistors, such as T1/T2 or T7/T14 or T35/T36.

A third advantage is that each of two halves of the circuit in FIG. 1 (with the exception of the presence of the capacitor C) is substantially the same, and each of two halves of the circuit in FIG. 2 is substantially the same, so that the design costs and manufacturing costs are reduced: each half of the circuit in FIG. 1, or in FIG. 2, can be fabricated using the same integrated circuit procedure.

A fourth advantage is that the circuit in FIG. 1 can be reconfigured to provide any of four logical functions by inverting, or not inverting, the two input signals and/or inverting, or not inverting, the output signal; and the circuit in FIG. 2 can be reconfigured to provide any of three logical functions by inverting, or not inverting, one (but not both) of the input signals, or by inverting, or not inverting, the output signal.

The transistors in each of FIGS. 1 and 2 are associated in differential transistor pairs, T1/T2, T3/T4, T5/T6, T8/T9, T10/T11, T12/T13, T7/T14, T31/T32, T33/T34, T35/T36, T37/T38, T39/T40 and T41/T42. In each differential transistor pair, the gates of two transistors in a differential pair receive distinguishable, and in some sense complementary, signals that determine which one, if any, of the two transistors will be ON at a given time.

What is claimed is:

1. A system for providing a selected logical function, the system comprising:

a first differential transistor pair, having first and second drains connected across respective first and second selected resistors to a reference voltage source;

a second differential transistor pair, having third and fourth drains connected across the respective first and second selected resistors to the reference voltage source;

a third differential transistor pair, having fifth and sixth drains connected across the respective second and first selected resistors to a reference voltage source;

a fourth differential transistor pair, having seventh and eighth drains connected across the respective first and second selected resistors to a reference voltage source;

a fifth differential transistor pair, having ninth and tenth drains connected to a common source of the first differential pair and the second differential pair, respectively;

a sixth differential transistor pair, having eleventh and twelfth drains connected to a common source of the third differential pair and the fourth differential pair, respectively;

a seventh differential transistor pair, having thirteenth and fourteenth drains connected to a common source of the fifth differential pair and the sixth differential pair, respectively;

first and second input terminals, connected to respective first and second gates of the first differential pair, and to respective first and second gates of the sixth differential pair;

third and fourth input terminals, connected to respective first and second gates of the fourth differential pair, and to respective first and second gates of the fifth differential pair;

a fifth grounded input voltage source, connected across a third resistor to a first gate of the second differential pair and to a second gate of the third differential pair and connected to a common source of the seventh differential pair;

a fourth resistor connecting the second gate of the second differential pair and the first gate of the third differential pair to the first gate of the second differential pair;

a sixth selected input voltage source, connected to the first and second gates of the seventh differential pair; and first and second output terminals, connected to the first and second drains of at least one of the first differential pair, the second differential pair, the third differential pair and the fourth differential pair, whereby a difference of first and second output terminal voltages provides at least one of the logical functions AND, NAND, OR and NOR in response to receipt of a first selected voltage difference at the first and second input terminals and to receipt of a second selected voltage difference at the third and fourth input terminals.

2. The system of claim 1, wherein a sum of electrical currents passing through at least one of said common source of said fifth differential pair, said common source of said sixth differential pair and said common source of said seventh differential pair is substantially constant.

3. The system of claim 1, further comprising a capacitor having a selected value and connecting said first gate of said second differential pair to said third input voltage source.

4. The system of claim 1, further comprising a transistor connected between said reference voltage source and said second gate of said second differential pair.

5. The system of claim 1, wherein one of said at least one logical functions, provided as a voltage difference at said first and second output terminals, is converted to another of said at least one logical functions by performing at least one of the two following operations: (1) changing polarity of said first and second input terminals, and changing polarity of said third and fourth input terminals; and (2) changing polarity of said first and second output terminals.

6. A system for providing a selected logical function, the system comprising:

a first differential transistor pair, having first and second drains connected across respective first and second selected resistors to a reference voltage source;

a second differential pair, having third and fourth drains connected across the respective first and second selected resistors to the reference voltage source;

a third differential transistor pair, having fifth and sixth drains connected across the respective first and second selected resistors to the reference voltage source;

a fourth differential transistor pair, having seventh and eighth drains connected across the respective first and second selected resistors to the reference voltage source;

a fifth differential transistor pair, having ninth and tenth drains connected to a common source of the first differential pair and the second differential pair, respectively;

a sixth differential transistor pair, having eleventh and twelfth drains connected to a common source of the third differential pair and the fourth differential pair, respectively, wherein the fifth and sixth differential pairs have a common source;

a bias transistor connected to a common source of the fifth and sixth differential pairs;

a first input terminal, connected to first and second gates of the first and second differential pair, respectively, and to a first gate of the sixth differential pair;

a second input terminal, connected to second and first gates of the first and second differential pairs, respectively, and to a second gate of the sixth differential pair;

a third input terminal, connected to first and second gates of the third and fourth differential pairs, respectively, and to a first gate of the fifth differential pair;

a fourth input terminal, connected to a second a first gates of the third and fourth differential pairs, respectively, and to a second gate of the fifth differential pair; and first and second output terminals, connected to the first and second drains of at least one of the first differential pair, the second differential pair, the third differential pair and the fourth differential pair, whereby a difference of first and second output terminal voltages provides at least one of the logical functions XOR, XNOR, and NOT in response to receipt of a first selected voltage difference at the first and second input terminals and to receipt of a second selected voltage difference at the third and fourth input terminals.

7. The system of claim 6, wherein a sum of electrical currents passing through each of said common source of said first differential pair, said common source of said second differential pair, said common source of said third differential pair and said common source of said fourth differential pair is substantially constant.

8. The system of claim 6, wherein one of said at least one logical functions, provided as a voltage difference at said first and second output terminals, is converted to another of said at least one logical functions by performing one of the three following operations: (1) changing polarity of said first and second input terminals, and changing polarity of said third and fourth input terminals; (2) changing polarity of said first and second output terminals; and (3) setting said one of said first voltage difference and said second voltage difference equal to a selected value.

* * * * *